(12) United States Patent
Chen et al.

(10) Patent No.: US 7,960,223 B2
(45) Date of Patent: Jun. 14, 2011

(54) STRUCTURE AND METHOD TO INTEGRATE DUAL SILICIDE WITH DUAL STRESS LINER TO IMPROVE CMOS PERFORMANCE

(75) Inventors: Xiangdong Chen, Poughquag, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 12/139,764

(22) Filed: Jun. 16, 2008

(65) Prior Publication Data

US 2009/0309164 A1  Dec. 17, 2009

(51) Int. Cl.
*H01L 21/8238* (2006.01)

(52) U.S. Cl. . 438/199; 438/275; 438/592; 257/E21.637; 257/E27.062

(58) Field of Classification Search ........... 257/E21.637, 257/E27.062; 438/199, 275, 592, FOR. 187
See application file for complete search history.

(56) References Cited

U.S. PATENT DOCUMENTS

| | | | | |
|---|---|---|---|---|
| 5,994,176 A | * | 11/1999 | Wu | 438/200 |
| 7,112,483 B2 | * | 9/2006 | Lin et al. | 438/231 |
| 7,459,756 B2 | * | 12/2008 | Lin et al. | 257/384 |
| 7,482,215 B2 | * | 1/2009 | Dyer et al. | 438/199 |
| 7,585,720 B2 | * | 9/2009 | Sudo | 438/199 |
| 2007/0077741 A1 | * | 4/2007 | Frohberg et al. | 438/586 |
| 2008/0102572 A1 | * | 5/2008 | Komatsubara | 438/199 |
| 2008/0121964 A1 | * | 5/2008 | Matsubara et al. | 257/310 |
| 2008/0150033 A1 | * | 6/2008 | Greene et al. | 257/369 |
| 2008/0157216 A1 | * | 7/2008 | Kim et al. | 257/374 |
| 2008/0164531 A1 | * | 7/2008 | Jawarani et al. | 257/369 |
| 2008/0169510 A1 | * | 7/2008 | Kumar et al. | 257/368 |
| 2008/0185659 A1 | * | 8/2008 | Ke et al. | 257/371 |
| 2008/0191285 A1 | * | 8/2008 | Ko et al. | 257/369 |
| 2009/0014808 A1 | * | 1/2009 | Lee et al. | 257/369 |
| 2009/0065872 A1 | * | 3/2009 | Zhu | 257/369 |
| 2009/0108348 A1 | * | 4/2009 | Yang et al. | 257/345 |
| 2009/0291540 A1 | * | 11/2009 | Zhang et al. | 438/229 |
| 2010/0065919 A1 | * | 3/2010 | Nam et al. | 257/369 |

* cited by examiner

*Primary Examiner* — George Fourson
(74) *Attorney, Agent, or Firm* — Scully, Scott, Murphy & Presser, P.C.; H. Daniel Schnurmann

(57) ABSTRACT

The present invention provides a semiconducting device including a substrate including a semiconducting surface having an n-type device in a first device region and a p-type device in a second device region, the n-type device including a first gate structure present overlying a portion of the semiconducting surface in the first device region including a first work function metal semiconductor alloy in the semiconducting surface adjacent to the portion of the semiconducting surface underlying the gate structure, and a first type strain inducing layer present overlying the first device region; and a p-type device including a second gate structure present overlying a portion of the semiconducting surface in the second device region including a second work function metal semiconductor alloy in the semiconducting surface adjacent to the portion of the semiconducting surface underlying the gate structure, and a second type strain inducing layer present overlying the second device region.

17 Claims, 6 Drawing Sheets

STRUCTURE AND METHOD TO INTEGRATE DUAL SILICIDE WITH DUAL STRESS LINER TO IMPROVE CMOS PERFORMANCE

FIELD OF INVENTION

The present invention relates to semiconductor devices and methods of forming semiconductor devices. More particularly, a semiconductor device is provided having a dual silicide and dual strain inducing layers for performance enhancements in n-type conductivity and p-type conductivity devices of a complementary metal oxide semiconductor (CMOS) device.

BACKGROUND OF THE INVENTION

The continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits.

Since it has become increasingly difficult to improve MOSFETs and therefore complementary metal oxide semiconductor (CMOS) performance through continued scaling, methods for improving performance without scaling have become critical. One approach for doing this is to increase carrier (electron and/or hole) mobilities.

SUMMARY OF THE INVENTION

In one aspect, the present invention is directed to a semiconductor structure in which strain inducing layers and metal semiconductor alloy compositions are selected to provide performance enhancement.

Broadly, a semiconductor device is provided that includes:
a substrate including a semiconducting surface and having a first device region and a second device region;
a first conductivity type device comprising a first gate structure present on a portion of the semiconducting surface in the first device region and including a first work function metal semiconductor alloy in the semiconducting surface adjacent to the portion of the semiconducting surface underlying the gate structure, and a first type strain inducing layer present overlying the first device region; and
a second conductivity type device comprising a second gate structure present on a portion of the semiconducting surface in the second device region and including a second work function metal semiconductor alloy in the semiconducting surface adjacent to the portion of the semiconducting surface underlying the gate structure, and a second type strain inducing layer present overlying the second device region.

In another embodiment, a CMOS device is provided in which the edge of the strain inducing layers are substantially aligned to the edge of the metal semiconductor alloy at the interface of the first device region and the second device region. Broadly, the semiconductor device includes:
a substrate including a semiconducting surface and having a first device region and a second device region;
a first type conductivity type device comprising a first gate structure present on a portion of the semiconducting surface in the first device region and including a first work function metal semiconductor alloy in the semiconducting surface adjacent to the portion of the semiconducting surface underlying the gate structure, and a first type strain inducing layer present overlying the first device region, wherein an edge of the first type strain inducing layer is substantially aligned to an edge of the first work function metal semiconductor alloy at an interface of the first device region and the second device region; and
a second conductivity type device comprising a second gate structure present on a portion of the semiconducting surface in the second device region and including a second work function metal semiconductor alloy in the semiconducting surface adjacent to the portion of the semiconducting surface underlying the gate structure, and a second type strain inducing layer present overlying the second device region, wherein an edge of the second type strain inducing layer is substantially aligned to an edge of the second work function metal semiconductor alloy at an interface of the first device region and the second device region.

In another aspect, a method is provided in which strain inducing layers and metal semiconductor alloys may be positioned within a semiconductor device to provide a performance enhancement. Broadly, the method of forming a semiconductor device includes:
providing a substrate including a semiconducting surface;
forming first conductivity type devices including first gate structures in a first region of the substrate and second conductivity type devices including second gate structures in a second device region of the substrate;
forming a protective dielectric mask overlying the second device region;
forming a first work function metal semiconductor alloy adjacent the first gate structures in the first device region;
forming a first strain inducing layer overlying the first device region of the substrate and atop the protective dielectric mask that is present in the second device region of the substrate; removing the first strain inducing layer that is overlying the protective dielectric mask and the dielectric mask to expose the second conductivity type devices;
forming a second work function metal semiconductor alloy adjacent the second gate structures in the second device region; and
forming a second strain inducing layer overlying the second device region of the substrate.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
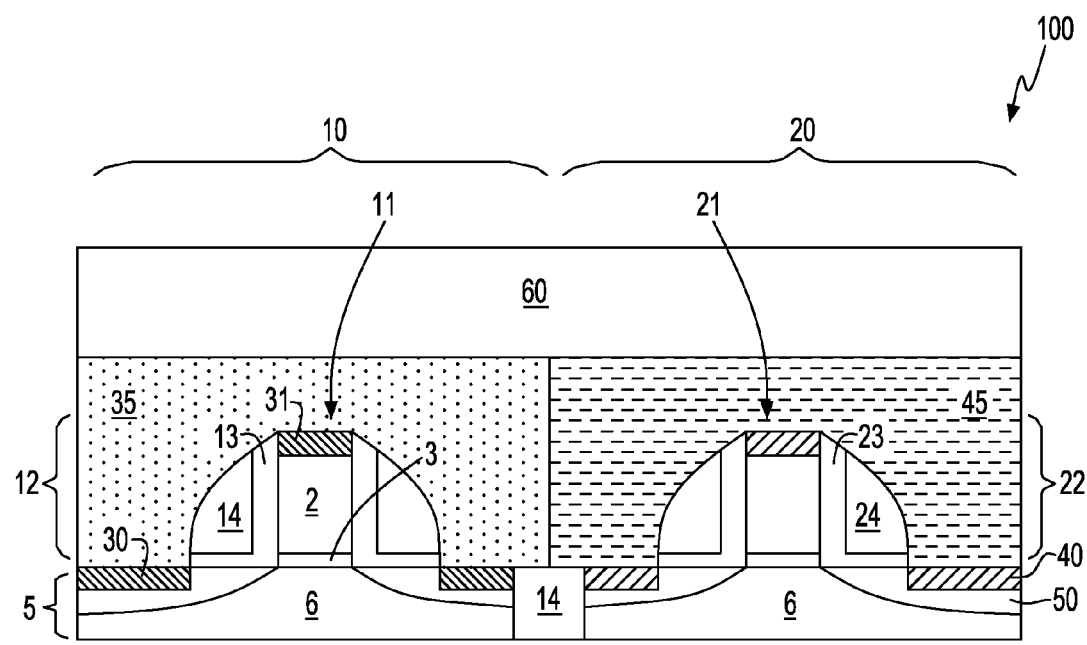
FIG. 1 is a side cross-sectional view of one embodiment of a semiconductor device including metal semiconductor alloys selected to provide a work function corresponding to n-type and p-type device performance and strain inducing liners corresponding to n-type and p-type device performance, in accordance with present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention relates to structures and methods for forming a semiconductor device. In one aspect, structures and methods are provided for forming semiconductor devices, in which the work function of the metal semiconductor alloy contacts to the source region and drain region may be selected to correspond to the performance characteristics of n-type and p-type devices and stain inducing layers may be selected to produce a strain corresponding to the performance characteristics of n-type and p-type devices. When describing the following structures and methods, the following terms have the following meanings, unless otherwise indicated.

As used herein, "semiconductor device" refers to an intrinsic semiconductor material that has been doped, that is, into which a dopant has been introduced, giving it different electrical properties than the intrinsic semiconductor. Doping involves adding dopant atoms to an intrinsic semiconductor, which changes the electron and hole carrier concentration of the intrinsic semiconductor at thermal equilibrium. Dominant carrier concentrations in an extrinsic semiconductor classify it as either an n-type or p-type semiconductor.

"Conductivity type" denotes whether the majority of carriers in an extrinsic semiconductor device is p-type, i.e., having a majority of holes as charge carriers, or n-type, having a majority of electrons as charge carriers.

As used herein, "p-type" refers to the addition of trivalent impurities to an intrinsic semiconductor substrate that create deficiencies of valence electrons, such as boron, aluminum or gallium to an intrinsic Si-containing substrate.

As used herein, "n-type" refers to the addition of pentavalent impurities to an intrinsic semiconductor substrate that contributes free electrons, such as antimony, arsenic or phosphorous to an intrinsic Si-containing substrate.

A "gate structure" means a structure used to control output current (i.e., flow of carriers in the channel) of a semiconducting device through electrical or magnetic fields.

The term "strain inducing layer" means a layer that has a compressive or tensile intrinsic strain that transmits the compressive or tensile intrinsic strain to the channel of the device.

A "compressive strain inducing layer" means that the material is under compaction, i.e., a decrease of volume. Consistent with the convention used to indicate compressive force a compressive strain is indicated by a positive sign ("+").

A "tensile strain inducing layer" means the material is under expansion, i.e., an increase of volume. Consistent with the convention used to indicate negative force a negative strain is indicated by a negative sign ("-").

The "work function" is the least amount of energy required to remove an electron from the surface of a conducting material.

The term "metal semiconductor alloy" is a substance with metallic properties, composed of two or more chemical elements of which at least one is a metal and another is a semiconductor.

As used herein, a "metal" and "metallic" is a material with electrically conductive properties, wherein in metals the atoms are held together by the force of a metallic bond; and the energy band structure of the metal's conduction and valence bands overlap, and hence, there is no energy gap.

As used herein, the "insulating" and/or "dielectric" denote a material having a room temperature conductivity of less than about $10^{-10} (\Omega\text{-m})^{-1}$.

"Electrically conductive" and/or "electrically communicating" as used through the present disclosure means a material typically having a room temperature conductivity of greater than $10^{-8} (\Omega\text{-m})^{-1}$.

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element as a layer, region or substrate is referred to as being "on" or "atop" or "over" or "overlying" or "below" or "underlying" another element, it can be directly on the other element or intervening elements may also be present. In contrast, when an element is referred to as being "directly on" or "directly over" of in "direct physical contact" with another element, there are no intervening elements present.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A semiconductor device is provided in which the structure provided results from a dual silicide process, i.e., dual metal semiconductor alloys, in combination with a dual stress liner process. In one embodiment, the composition of the metal semiconductor alloy contacts to the n-type devices, i.e., nFET device, has a work function substantially aligned with the conduction band of the n-type device, and the composition of the metal semiconductor alloy contacts to the p-type devices, i.e., pFET devices, has a work function substantially aligned to the valence band of the p-type devices. The strain inducing layer overlying the p-type devices typically is a compressive strain inducing dielectric layer and the strain inducing layer overlying the n-type devices typically is a tensile strain inducing dielectric layer.

The term "work function substantially aligned with the conduction band" denotes that the work function of the metal semiconductor alloy has a potential that is positioned within the band gap of the n-type device, ranging from approximately the middle of the band gap to the conduction band of an n-type material. Silicide contacts having a work function substantially aligned with the conduction band produce a low contact resistance n-type silicide. The term "work function substantially aligned with the valence band" denotes that the work function of the metal semiconductor alloy has a potential, which is positioned within the band gap of the p-type device, ranging from approximately the middle of the band gap to the valence band of a p-type material. Silicide contacts having a work function substantially aligned with the valence band produce a low contact resistance p-type silicide.

FIG. 1 depicts one embodiment of a semiconductor device 100 including metal semiconductor alloys selected to provide a work function corresponding to n-type and p-type device performance and strain inducing liners corresponding to n-type and p-type device performance. In one embodiment, the inventive semiconducting device 100 includes a substrate 5 including a semiconducting surface 6 having an n-type device 11 in a first device region 10 and a p-type device 21 in a second device region 20. The n-type device 11 may include a first gate structure 12 present overlying a portion of the semiconducting surface 6 in the first device region 10, a first work function metal semiconductor alloy 30 in the semiconducting surface 6 adjacent to the portion of the semiconducting surface 6 underlying the first gate structure 12, and a first type strain inducing layer 35 present overlying the first device region 10. The p-type device 21 may include a second gate structure 22 present overlying a portion of the semiconducting surface 6 in the second device region 20, a second work function metal semiconductor alloy 40 in the semiconducting surface 6 adjacent to the portion of the semiconducting surface 6 underlying the gate structure 22, and a second type strain inducing layer 45 present overlying the second device region 20. A cap dielectric layer 60 may be present overlying the first device region 10 and the second device region 20.

When the first work function metal semiconductor alloy 30 is present as the contact to an n-type device 11 and the second work function metal semiconductor alloy 40 is present as the contact to a p-type device 21, the first work function metal semiconductor alloy 30 has a lesser work function than the second work function metal semiconductor alloy 40. The first work function metal semiconductor alloy 30 may be a metal silicide, which may be composed of a metal comprising Er, Yb, Dy, Lu, Gd, Tb, Ho or combinations thereof. In one embodiment, the first metal silicide is composed of YbSi, $CoSi_2$, $VSi_2$, ErSi, $ZrSi_2$, HfSi, $MoSi_2$, $CrSi_2$, $Zr_5Si_3$, $IrSi_3$, NiSi, and combinations thereof. The second work function metal semiconductor alloy 40 may be a second metal silicide that is composed of a metal comprising Pt, Or, Ir or combinations thereof. In one embodiment, the second metal silicide is composed of PtSi, $Pt_2Si$, IrSi, $Pd_2Si$, $CoSi_2$, PdSi, RhSi, YSi, $Zr_2Si$ or a combination thereof.

In one embodiment, in which the first strain inducing layer 35 is present overlying the n-type device 11 and the second strain inducing layer 45 is present overlying the p-type device 21, the first strain inducing layer 35 produces a tensile strain in the n-type device 11 and the second strain inducing layer 45 produces a compressive strain in the p-type device 21. In one example, the first strain inducing layer 35 is a tensile strain inducing silicon nitride layer, and the second strain inducing layer 45 is a compressive strain inducing silicon nitride layer.

The first strain inducing layer 35 may include a tensile strain inducing silicon nitride layer having an intrinsic tensile strain ranging from about 1000 MPa to about 1600 MPa and transfers a tensile strain into the semiconducting surface 6 of the first device region 10 ranging from about 150 MPa to about 200 MPa. In one embodiment, the second strain inducing layer 45 includes a compressive strain inducing silicon nitride layer having an intrinsic compressive strain ranging from about 1400 MPa to about 4000 MPa and transfers a compressive strain into the semiconducting surface 6 of the second device region 20 ranging from about 200 MPa to about 1500 Mpa. It is noted that the above example is provided for illustrative purposes only, wherein other strain levels have been contemplated, as strain inducing layer 35, 45 may have a tensile or compressive strain as great as approximately 1.5 GPa.

Figure 2:
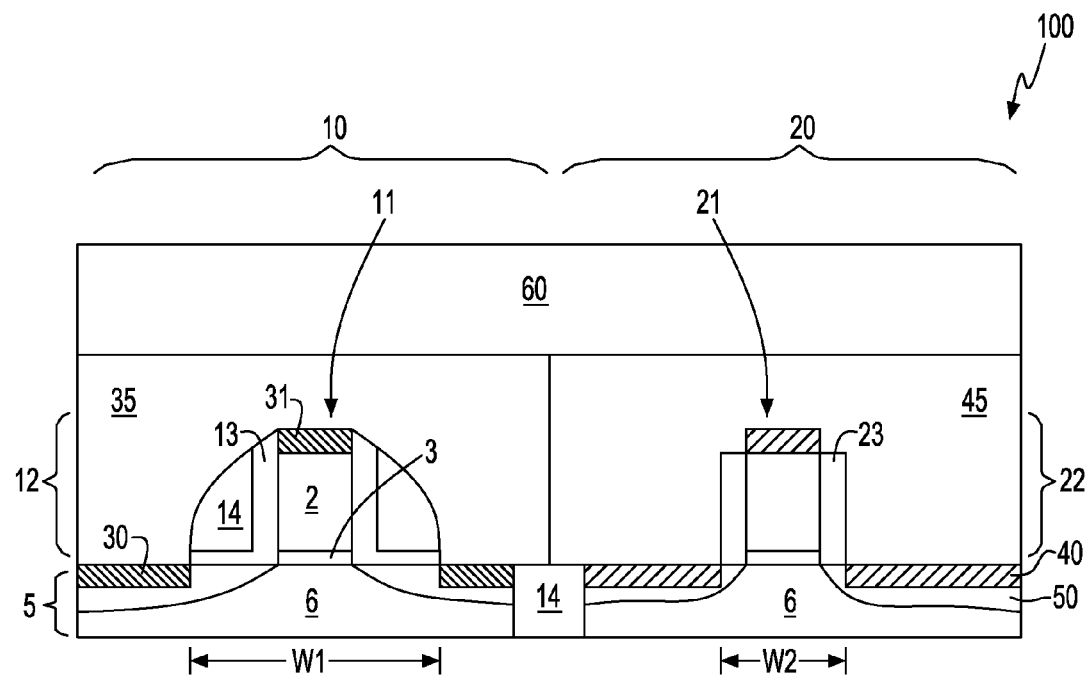
FIG. 2 is a side cross-sectional view of another embodiment of a semiconductor device including metal semiconductor alloys selected to provide a work function corresponding to n-type and p-type device performance and strain inducing liners corresponding to n-type and p-type device performance, in accordance with present invention.

FIG. 2 depicts another embodiment of a semiconductor device 100 including metal semiconductor alloys 30, 40 selected to provide a work function corresponding to n-type and p-type device performance and strain inducing liners 35, 45 corresponding to n-type and p-type device performance. In one embodiment, the first gate structure 12 further includes at least one first spacer 13, 14, that increases the width of the first gate structure 12 to a first width $W_1$, and the second gate structure 22 further includes at least one second spacer 23 that increases the width of the second gate structure 22 to a second width $W_2$, wherein the first width $W_1$ is greater than the second width $W_2$. In one embodiment, the first gate structure 12 includes an extension spacer 13 abutting the sidewall of the first gate structure 12 and a deep source and drain region spacer 14 abutting the extension spacer 13. By reducing the width of the second gate structure 22 and bringing the compressive strain inducing layer in closer proximity to the channel of the p-type device 21, a mobility enhancement may be recognized.

Figure 3:
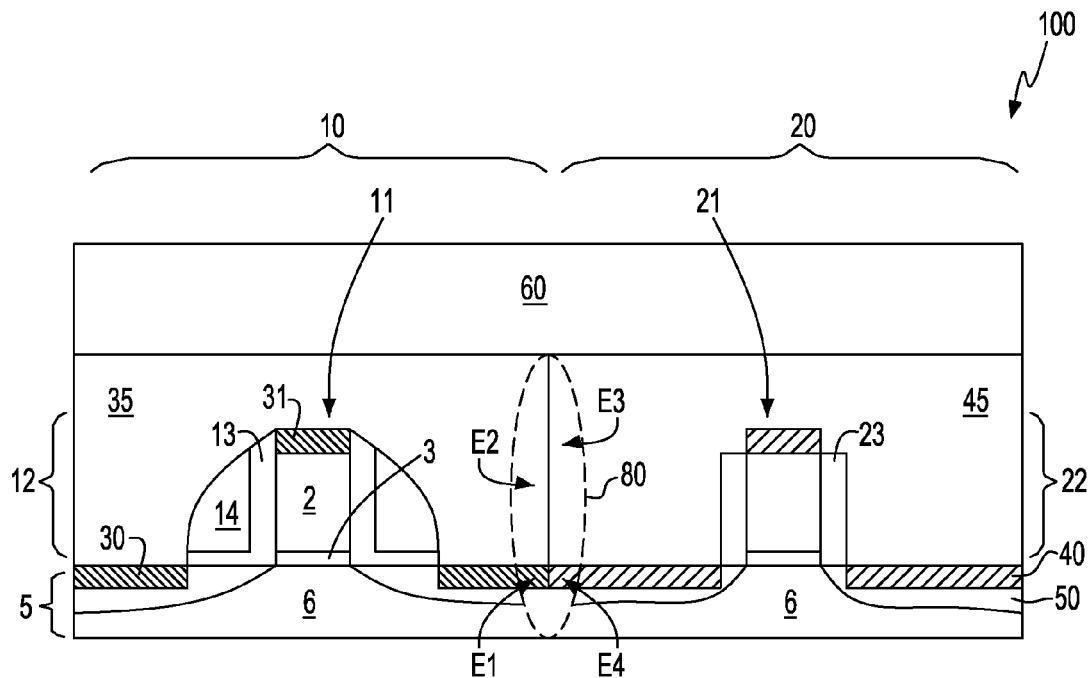
FIG. 3 is a side cross-sectional view of another embodiment of the semiconductor device including a first metal semiconductor alloy aligned to a first strain inducing liner and a second metal semiconductor alloy aligned to a second strain inducing liner, in accordance with the present invention.

FIG. 3 depicts a CMOS device 100 in which the edge of the strain inducing layers are substantially aligned to the edge of the metal semiconductor alloy at the interface 80 of the first device region 10 and the second device region 20. The interface 80 is the border between the first device region 10 and the second device region 20. In the example depicted in FIG. 3, an isolation region may not be present separating the first device region 10 and the second device region 20.

The CMOS device 100 includes a substrate 5 including a semiconducting surface 6 having an n-type device 11 in a first device region 10 and a p-type device 21 in a second device region 20. The n-type device 11 may include a first gate structure 12 present on a portion of the semiconducting surface 6 in the first device region 10 that includes a first work function metal semiconductor alloy 30 in the semiconducting surface 6 adjacent to the portion of the semiconducting surface 6 that is underlying the gate structure 12. A first type strain inducing layer 35, such as a tensile strain inducing layer, may be present overlying the first device region 10. The edge E2 of the first type strain inducing layer 35 may be substantially aligned to an edge E1 of the first metal semiconductor alloy 30 at an interface 30 of the first device region 10 and the second device region 20.

The p-type device 21 may include a second gate structure 22 present on a portion of the semiconducting surface 6 in the second device region 20 including a second work function metal semiconductor alloy 40 in the semiconducting surface 6 adjacent to the portion of the semiconducting surface 6 underlying the gate structure 22. A second type strain inducing layer 45, such as a compressive strain inducing layer, may be present overlying the second device region 20. The edge E3 of the second type strain inducing layer 45 may be substantially aligned to an edge of the second work function metal semiconductor layer 40 at an interface 80 of the first device region 10 and the second device region 20.

The alignment of the edge of the strain inducing layers to the edge of the metal semiconductor alloy at the interface 80 of the first device region 10 and the second device region 20 may reduce the incidence of leakage than can occur with the metal semiconductor alloys overlap at the interface. In one embodiment, by aligning the edge of the strain inducing layers to the edge of the metal semiconductor alloy at the interface 80, the first work function metal semiconductor alloy 30 may have a substantially coplanar upper surface with the upper surface of the second work function metal semiconductor alloy 40. Additionally, the first work function metal semiconductor alloy 30 may have a substantially coplanar lower surface with the lower surface of the second work function metal semiconductor alloy 40.

The various components of the structure shown in FIGS. 1-3, as well as one embodiments of a method that can be used in forming the same will now be described in greater detail referring to FIGS. 4-12.

Figure 4:
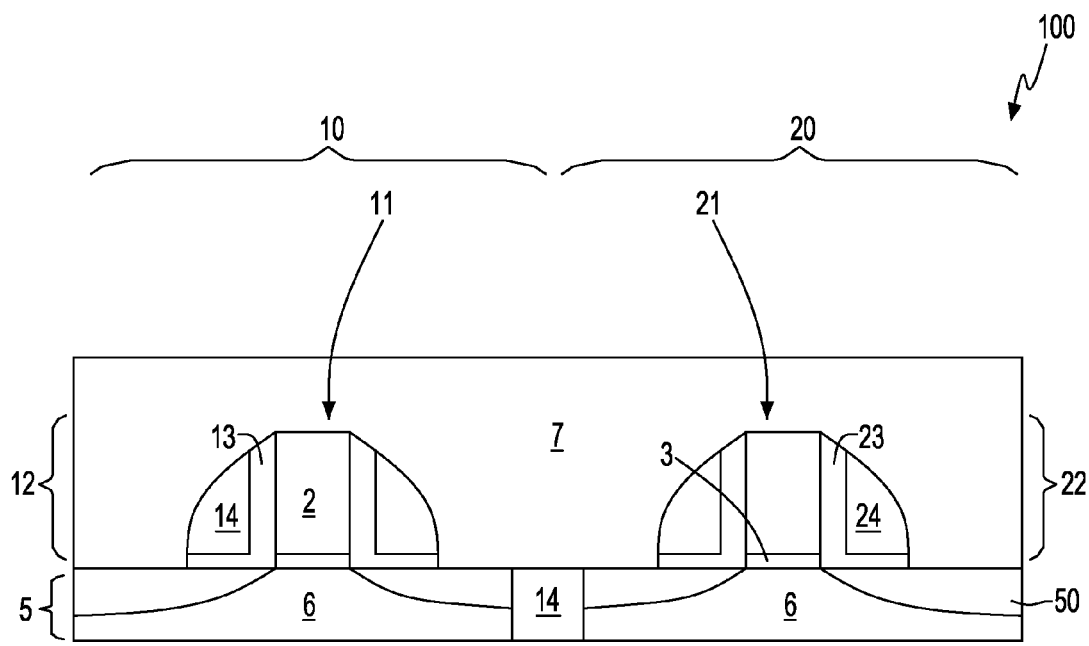
FIG. 4 is a side cross-sectional view of a dielectric mask layer overlying an initial structure as used in a method for forming a semiconductor device, the initial structure including a semiconducting substrate including a first device region including an n-type device and a second device region including a p-type device, in accordance with the one embodiment of the present invention.

Referring to FIG. 4, an initial structure is provided having an n-type device 11 positioned on a semiconducting surface 6 of a first device region 10 and a p-type device 21 positioned on a semiconducting surface 6 of a second device region 20, wherein the semiconducting surfaces 6 of the first device region 10 and the second device region 20 are positioned on a substrate 5 of a silicon (Si)-containing material. Si-containing materials include, but are not limited to: silicon, single crystal silicon, polycrystalline silicon, silicon germanium, silicon-on-silicon germanium, amorphous silicon, silicon-on-insulator (SOI), silicon germanium-on-insulator (SGOI), and annealed polysilicon. The substrate 5 further includes an isolation region 14 separating the second device region 20 from the first device region 10. It is noted that although FIG. 4 depicts only one p-type device 21 in the second device region 20 and only one n-type device 11 in the first region 10, multiple devices within the first device region 10 and second device region 20 are also contemplated and therefore within the scope of the present disclosure. Further it is noted that other substrate 5 material have been contemplated such as type III-V semiconductors.

The n-type device 11 may be an n-type field effect transistor (nFET), i.e., n-channel field effect transistor, and the p-type device 21 is a p-type field effect transistor (pFET), i.e., p-channel field effect transistor. The nFET and pFET devices are formed by utilizing conventional processing steps that are capable of fabricating MOSFET devices. Each device comprises gate structures 12, 22 including a gate conductor 2 atop a gate dielectric 3. At least one set of sidewall spacers 13, 14, 23, 24 may be positioned abutting the gate structures 12, 22. Source and drain regions 50 including extension regions 51 are positioned within the substrate 5 and define a device channel. The source and drain regions 50 of the nFET device are n-type doped. The source and drain regions 50 of the pFET device are p-type doped. N-type dopants in the Si-containing substrate are elements from Group V of the Periodic Table of Elements, such as As, Sb, and/or P. P-type dopants in Si-containing substrate are elements from Group III of the Periodic Table of Elements, such as B.

Still referring to FIG. 4, following a source and drain region anneal, a dielectric layer 7 is deposited atop the substrate 5 in both the first device region 10 and second device region 20. In one embodiment, the dielectric layer 7 may be an oxide, nitride or oxynitride. In another embodiment, the dielectric layer 7 is a conformal oxide, such as $SiO_2$, having a thickness ranging from 20 nm to about 100 nm. It is noted that other dielectric materials are contemplated and are also within the scope of the present invention, so long as the material of the dielectric layer 7 maintains integrity during subsequent silicidation processes. In one embodiment, the dielectric layer 7 is formed using a deposition process, such as chemical vapor deposition (CVD) or physical vapor deposition (PVD). Chemical Vapor Deposition is a deposition process in which a deposited species is formed as a result of chemical reaction between gaseous reactants at greater than room temperature (25° C. to 600° C.); wherein a solid product of the reaction is deposited on the surface on which a film, coating, or layer of the solid product is to be formed. Variations of CVD processes include, but not limited to, Atmospheric Pressure CVD (APCVD), Low Pressure CVD (LPCVD), Plasma Enhanced CVD (EPCVD), Metal-Organic CVD (MOCVD) and combinations thereof. In another embodiment, the dielectric layer 7 may be formed using a thermal growth processes, such as thermal oxidation or thermal nitridation.

Figure 5:
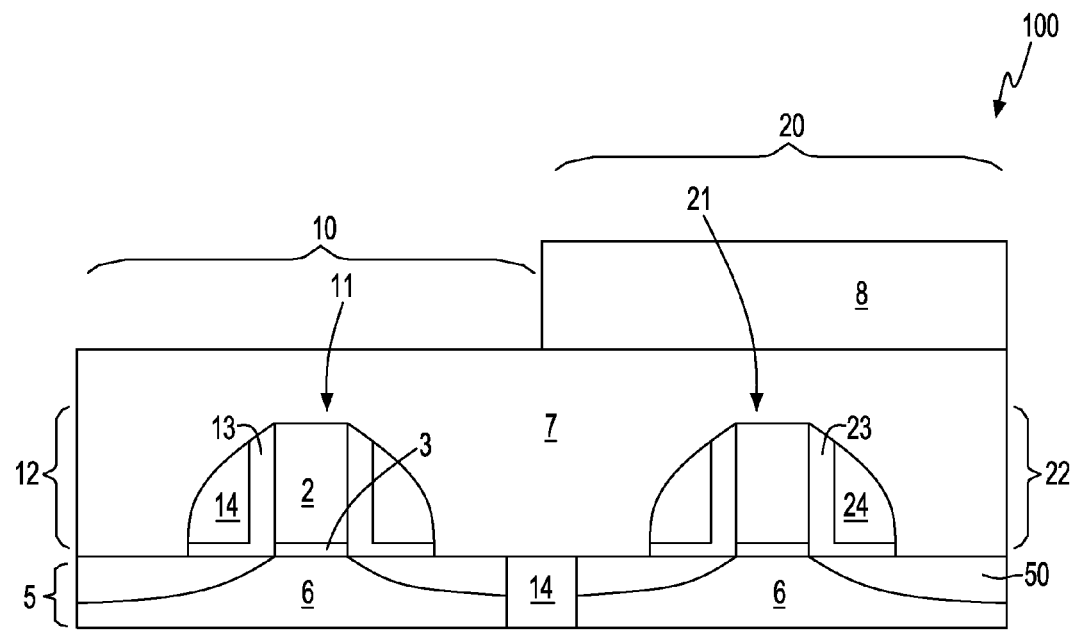
FIG. 5 is a side cross-sectional view of forming a photoresist mask overlying the dielectric mask layer in the second device region of the semiconducting substrate, in accordance with the present invention.

Referring to FIG. 5, in a following process step, a photoresist mask 8 is formed overlying the dielectric layer 7 in the second device region 20 of the semiconducting substrate 5. In one embodiment, a patterned photomask 8 is positioned overlying the substrate 5 using photolithography and etch processes. The patterned photomask 8 is provided by a blanket layer of photoresist material that is deposited on the surface of the dielectric layer 7 utilizing a deposition process such as, for example, CVD, PECVD, evaporation or spin-on coating. The blanket layer of photoresist material can be patterned into a patterned photomask 8 by utilizing a lithographic process that may include exposing the photoresist material to a pattern of radiation and developing the exposed photoresist material utilizing a resist developer.

Figure 6:
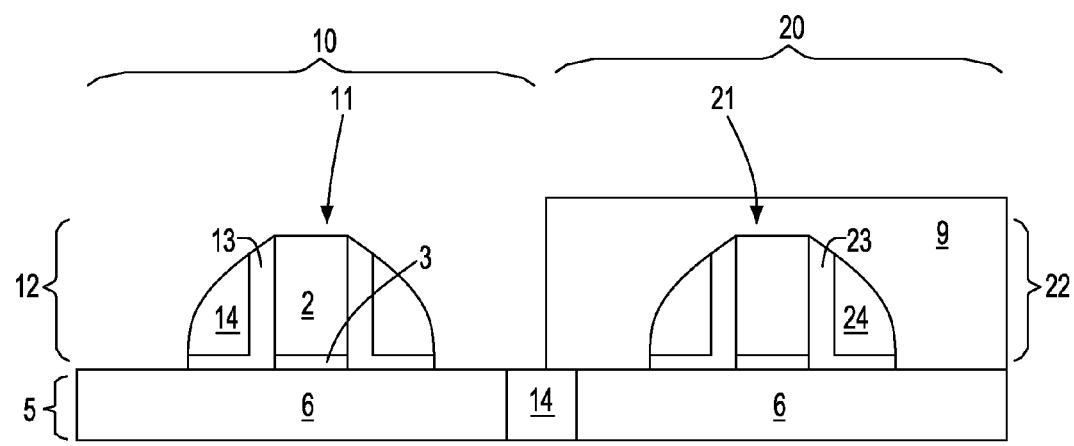
FIG. 6 is a side cross-sectional view of one embodiment of etching the dielectric mask layer that is present in the first device region of the semiconducting substrate, wherein the remaining portion of the mask dielectric layer provides a first protective mask, in accordance with the present invention.

Referring to FIG. 6, in one embodiment, with the patterned photomask 8 in place, the exposed portion of the dielectric layer 7 is removed to provide the protective dielectric mask 9 utilizing one or more etching processes, such as an anisotropic etch process, wherein the portions of the dielectric layer 7 that are removed expose the n-type device 11 in the first device region 10. As used herein, an anisotropic etch process denotes a material removal process in which the etch rate in the direction normal to the surface to be etched is much higher than in the direction parallel to the surface to be etched. In one embodiment, the one or more etching processes may include dry etching or wet etching. In one embodiment, reactive-ion etching (RIE) is used. Reactive Ion Etching (RIE) is a form of plasma etching in which during etching the surface to be etched is placed on the RF powered electrode, wherein the surface to be etched takes on a potential that accelerates the etching species extracted from a plasma toward the surface, in which the chemical etching reaction is taking place in the direction normal to the surface. Other examples of dry etching that can be used at this point of the present invention include ion beam etching, plasma etching or laser ablation. After the exposed portion of the dielectric layer 7 are removed to provide the protective dielectric mask 9, the patterned photomask 8 is removed utilizing a resist stripping process.

Figure 7:
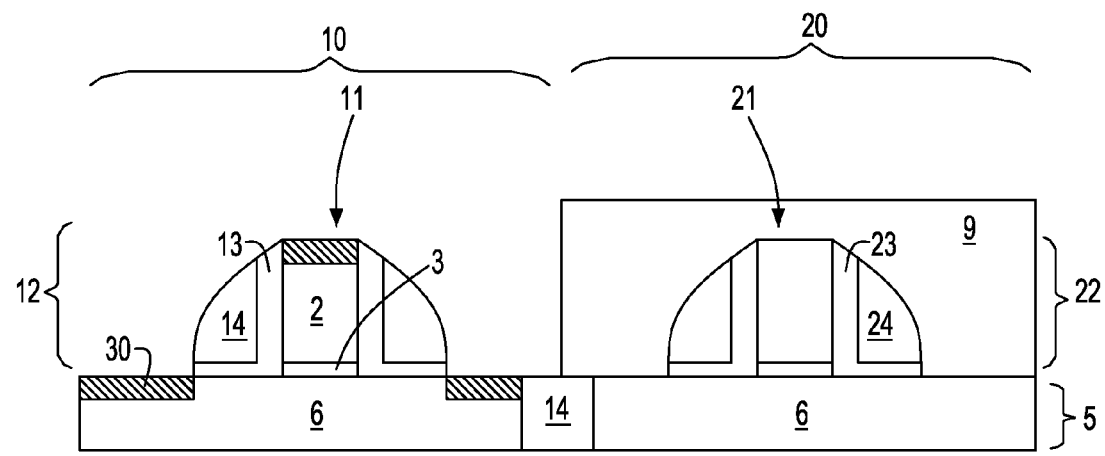
FIG. 7 is a side cross-sectional view depicting one embodiment of forming a first work function metal semiconductor alloy adjacent the first gate structures in the first device region, in accordance with the present invention.

FIG. 7 depicts one embodiment of forming a first work function metal semiconductor alloy 30 adjacent the first gate structures 12 in the first device region 10. The forming of the first work function metal semiconductor alloy 30 adjacent the first gate structure 12 in the first device region 10 may include depositing a first metal on the first device region 10 of semiconducting substrate 5 adjacent to a portion of the semiconducting substrate 5 underlying the first gate structures 12; and annealing the first metal.

The first work function metal semiconductor alloy 30 (low resistance n-type silicide contact) is formed atop the source and drain regions 50 of the semiconducting surface 6 of in the first device region 10 of the substrate 5. In one embodiment, a first metal semiconductor alloy gate contact 31 is also formed atop the gate conductor 2 of the n-type devices 11 in the first device region 10. Metal alloy semiconductor formation, such as silicide formation, typically requires depositing a metal onto the surface of a semiconductor material, such as a Si-containing material. The first work function metal semiconductor alloy 30 is a low resistance n-type metal semiconductor alloy, wherein the first metal semiconductor alloy 30 has a work function that substantially aligns to the conduction band of the n-type source and drain regions 50 of the semiconductor surface 6 within the first device region 10 of the substrate 5. The term "low contact resistance n-type metal semiconductor alloy" denotes a metal semiconductor alloy contact to n-type devices having a contact resistance of less than $10^{-7}$ ohms·cm$^{-2}$.

Metals that can provide a first work function metal semiconductor alloy having a work function substantially aligned to the conduction band of the n-type doped source and drain regions 50 within the first device region 10 of the substrate 5 include Co, Er, V, Zr, Hf, Mo or Cr among others. The metal layer may be deposited using physical deposition methods, such as plating and sputtering. The metal layer may be deposited to a thickness ranging from about 50 Å to about 200 Å. In one embodiment, the metal layer is deposited to a thickness on the order of approximately 70 Å.

Following deposition, the structure is subjected to an annealing step including, but not limited to, rapid thermal annealing. During annealing, the deposited metal reacts with the semiconductor material forming a metal semiconductor alloy, such as a metal silicide. In the embodiment, in which the deposited metal comprises Co, Er, V, Zr, Hf, Mo, Ni, or Cr, the first metal semiconductor alloy 30 can be $CoSi_2$, $VSi_2$, ErSi, $ZrSi_2$, HfSi, $MoSi_2$, NiSi, or $CrSi_2$. For $CoSi_2$, the first anneal is completed at a temperature ranging from about 350° C. to about 600° C. for a time period ranging from about 1 second to about 90 seconds. In some embodiments of the present invention, the low resistance n-type metal silicide contacts 30 may further comprise an optional TiN layer.

When the first work function metal semiconductor alloy 30 is a silicide, silicidation requires that the silicide metal be deposited atop a Si-containing surface. Therefore, silicide forms atop the exposed portions of the Si-containing substrate 5, but does not form atop the protective dielectric mask 9 or the sidewall spacers 13, 14. In one embodiment, the non-reacted metal positioned on sidewall spacers 13, 14, the isolation region 4 and the first protective mask 9 are then stripped using a wet etch.

An optional second anneal may be needed to reduce the resistivity of the low resistivity n-type metal semiconductor alloy contact. This second anneal temperature ranges from 600° C. to 800° C., for a time period ranging from about 1 second to 60 seconds. The second anneal can form a disilicide such as, $CoSi_2$.

Figure 8:
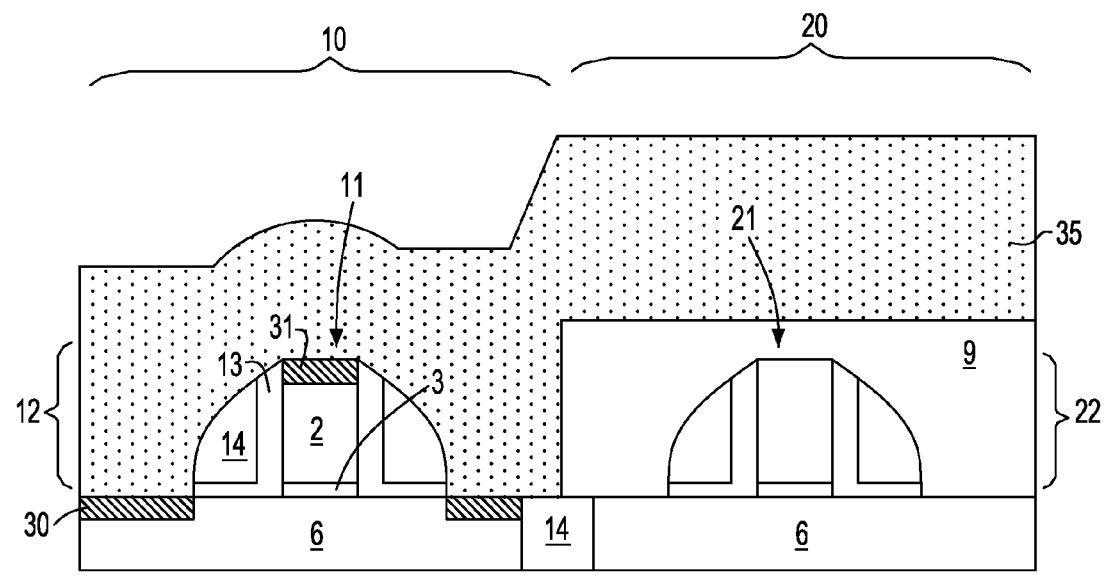
FIG. 8 is a side cross-sectional view depicting one embodiment of forming a first strain inducing layer overlying the first device region and second device region of the semiconducting substrate, in accordance with the present invention.

Referring to FIG. 8, in one embodiment, the first strain inducing layer 35 is formed overlying the first device region 10 and second device region 20 of the semiconducting substrate 5. In one embodiment, forming the first strain inducing layer 35 includes depositing a layer of silicon nitride that induces a tensile strain in the n-type devices 11 of the first device region 10. In one embodiment, the first strain inducing layer 35 is composed of $Si_3N_4$ that is deposited under conditions that produce an internal stress within the deposited layer.

The first strain inducing layer 35 may be first blanket deposited atop the entire substrate 5 including the first device region 10 and the second device region 20. The first strain inducing layer 35 can be deposited using a low temperature chemical vapor deposition (CVD) process, such as plasma enhanced chemical vapor deposition (PECVD) or rapid thermal chemical vapor deposition (RTCVD). Modifying the process conditions used to deposit the first strain inducing layer 35 can control whether the state of stress is tensile or compressive.

Plasma enhanced chemical vapor deposition (PECVD) can provide strained dielectrics having a compressive or tensile internal stress. The stress state of the strained dielectric layer deposited by PECVD can be controlled by changing the deposition conditions to alter the reaction rate within the deposition chamber. More specifically, the stress state of the deposited strained dielectric layer may be set by changing the deposition conditions such as: $SiH_4/N_2$/He gas flow rate, pressure, RF power, and electrode gap.

Rapid thermal chemical vapor deposition (RTCVD) can provide a first strain inducing layer 35 having an internal tensile stress. The magnitude of the internal tensile stress produced within the first strain inducing layer 35 deposited by RTCVD can be controlled by changing the deposition conditions. More specifically, the magnitude of the tensile stress within the deposited first strain inducing layer 35 may be set by changing deposition conditions such as: precursor composition, precursor flow rate and temperature.

In one embodiment of the present invention, the first strain inducing layer 35 can be $Si_3N_4$ deposited by PECVD under conditions to produce a tensile strained first strain inducing layer 35. The deposition conditions may include a low frequency power on the order of about 0 W to about 100 W, a high frequency power on the order of about 200 to about 600 W, a silane flow rate of about 50 sccm to about 200 sccm, an $NH_3$ flow rate on the order of about 1,500 sccm to about 3,000 sccm, and a deposition pressure of about 15 Torr or less.

Figure 9:
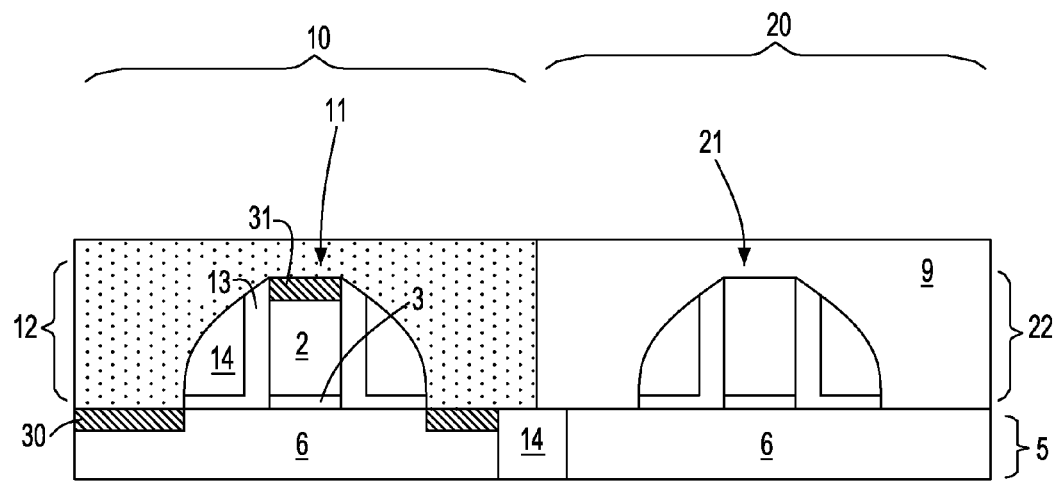
FIG. 9 is a side cross-sectional view depicting planarizing the structure depicted in FIG. 8, wherein following planarization the upper surface of the first strain inducing layer is substantially co-planar with the upper surface of the mask dielectric layer, in accordance with one embodiment of the present invention.

Referring to FIG. 9, following the formation of the first strain inducing layer 35, the first strain inducing layer 35 that is overlying the protective dielectric mask 9 is removed. In one embodiment, the first strain inducing layer 35 overlying the protective dielectric mask 9 in the second device region 20 is removed using a planarization process. As used herein, "planarization" is a material removal process that employs at least mechanical forces, such as frictional media, to produce a planar surface. The planarization process may include chemical mechanical planarization. "Chemical Mechanical Planarization" is a material removal process using both chemical reactions and mechanical forces to remove material and planarize a surface. The planarization process may be continued stopping on the protective dielectric mask 9 to provide an upper surface of the protective dielectric mask 9 that is coplanar with an upper surface of the first strain inducing layer 35 that is present in the first device region 10.

Figure 10:
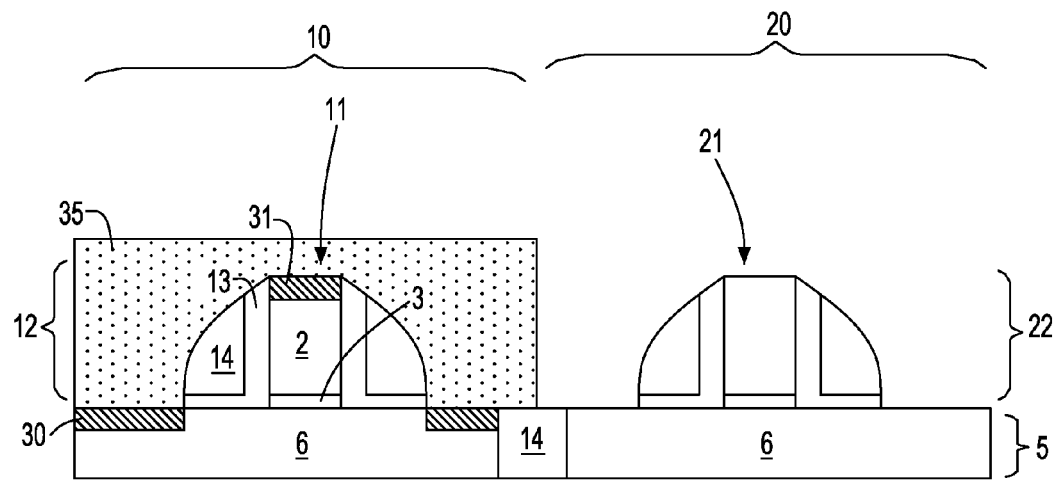
FIG. 10 is a side cross-sectional view depicting removing the remaining portion of the mask dielectric layer, in accordance with one embodiment of the present invention.

Referring to FIG. 10, in a following process step, the protective dielectric mask 9 is then be removed by etching with an etch chemistry selective that is selective to the first strain inducing layer 35 to expose the p-type device 21 in the second device region 20. In one embodiment, removing the protective dielectric mask 9 from the second device region 20 includes an anisotropic etch process, such as reactive ion etch.

Figure 11:
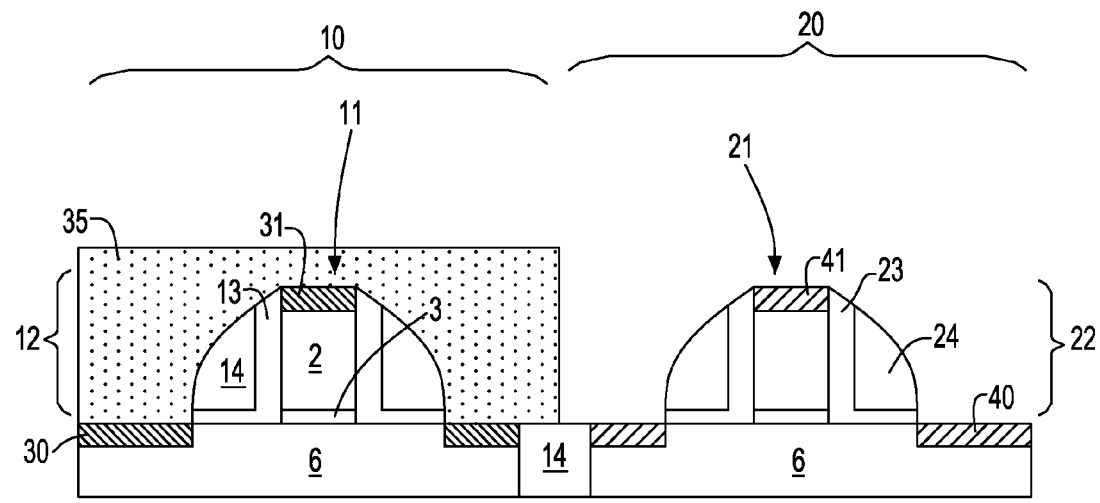
FIG. 11 is a side cross-sectional view depicting forming a second work function metal semiconductor alloy adjacent the second gate structures in the second device region, in accordance with the present invention.

Referring to FIG. 11, in one embodiment, in a following process step, a second work function metal semiconductor alloy 40 (low resistance p-type silicide contact) is formed atop the source and drain regions 50 of the semiconducting surface 6 in the second device region 20 of the substrate 5. The forming of the second work function metal semiconductor alloy 40 may include depositing a second metal on the semiconductor surface of the second device region 20 of the substrate 5 that is adjacent to a portion of the semiconductor surface 6 underlying the second gate structures 22; and annealing the second metal. In one embodiment, the second metal comprises Pt, Ir, Os or combinations thereof. In one embodiment, a metal semiconductor alloy gate contact 41 is also formed atop the gate conductor 2 of the p-type device 21 in the second device region 20.

The second work function metal semiconductor alloy 40 may be a low resistance p-type metal semiconductor alloy, wherein the second metal semiconductor alloy 40 has a work function that is substantially aligned to the valence band of the p-type doped source and drain regions 50 of semiconductor surface 6 within the second device region 20 of the substrate 5. The term "low contact resistance p-type metal semiconductor alloy" denotes a metal semiconductor alloy contact to a p-type device 21 having a contact resistance of less than $10^{-7}$ ohms·cm$^{-2}$.

Metals that can provide a second work function metal semiconductor alloy 40 having a work function substantially aligned to the valance band of the p-type source and drain regions 50 of the Si-containing substrate 5 include Pt, Ir, and Pd. The second work function metal semiconductor alloy 40 may be deposited using physical deposition methods, such as plating and sputtering. The second metal layer may be deposited to a thickness ranging from about 1 nm to about 10 nm.

In one embodiment, following deposition, the structure is subjected to an anneal process including, but not limited to, rapid thermal annealing. During annealing, the deposited second metal reacts with Si forming a second metal semiconductor alloy 40, such as a metal silicide, such as PtSi, Pt$_2$Si, IrSi, Pd$_2$Si. In one embodiment, in which the second work function metal semiconductor alloy 40 is composed of PtSi, the first anneal is completed at a temperature ranging from about 350° C. to about 600° C. for a time period ranging from about 1 second to about 90 seconds.

Figure 12:
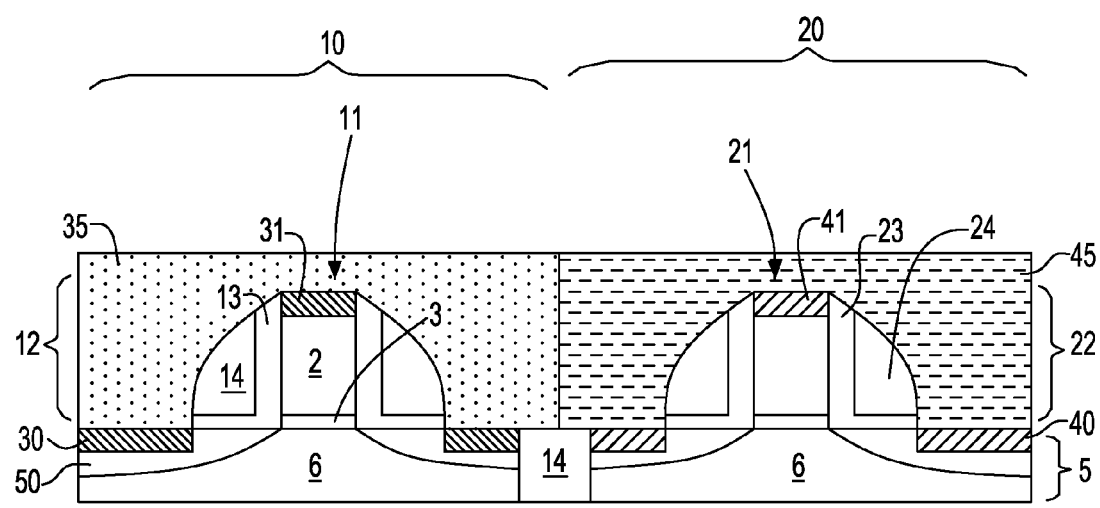
FIG. 12 is a side cross-sectional view depicting one embodiment of forming a second strain-inducing layer overlying the second device region of the semiconducting substrate, in accordance with the present invention.

Referring to FIG. 12, in a following process step, a second strain inducing layer 45 is formed overlying the second device region 20 of the semiconducting substrate 5. The second strain inducing layer 45 may be blanket deposited atop the first region 10 and the second device region 20 of the semiconducting substrate 5. In the embodiment, the second strain inducing layer 45 is deposited under conditions to produce a compressively strained dielectric layer. The second strain inducing layer 40 can be deposited using a low temperature chemical vapor deposition (CVD) process, such as plasma enhanced chemical vapor deposition (PECVD) or rapid thermal chemical vapor deposition (RTCVD). Modifying the process conditions used to deposit the first strain inducing layer 35 can control whether the state of stress is tensile or compressive.

In one embodiment, a compressively strained second strain inducing layer 45 can be produced using PECVD of Si$_3$N$_4$, in which the deposition conditions include a low frequency power on the order of about 500 to about 1,500 W, a high frequency power on the order of about 250 to about 500 W, a silane flow rate on the order of about 800 to about 2,000 sccm, an NH$_3$ flow rate on the order of about 6,000 to about 10,000 sccm, and a deposition pressure of about 10 Torr or less. The compressively strained second strain inducing layer 45 can be deposited to a thickness ranging from about 500 Å to about 1500 Å. In another embodiment, the compressively strained second strain inducing layer may have a thickness ranging from about 500 Å to about 1000 Å.

In one embodiment, prior to the deposition of the second strain inducing layer 45, the deep source and drain region spacers 24 that are present abutting the sidewall of the gate structure 22 of the p-type device 21 may be removed. By removing the deep source and drain regions spacers 24 prior to the deposition of the second strain inducing layer 45, the second strain inducing layer 45 may be brought in closer proximity to the channel region of the p-type device 21 in the second device region 20, and hence producing a greater compressive strain in the channel of the p-type device 21. The final semiconductor device structure of this embodiment is depicted in FIG. 2.

In a following process sequence, a layer of cap dielectric material 60 is blanket deposited atop the entire substrate and planarized to provide the structure depicted in FIG. 1. The blanket dielectric may be selected from the group consisting of silicon-containing materials such as SiO$_2$, Si$_3$N$_4$, SiO$_x$N$_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to, or from being porous and/or permeable to being non-porous and/or non-permeable.

The blanket cap dielectric material 60 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric may then patterned and etched to form via holes to the various source/drain and gate conductor regions of the substrate. Following via formation interconnects are formed by depositing a conductive metal into the via holes using conventional processing, such as CVD or plating. The conductive metal may include, but is not limited to: tungsten, copper, aluminum, silver, gold, and alloys thereof.

It is noted that the above process sequence is provided for illustrate purposes only, as other process flows have been considered and are within the scope of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
   providing a substrate including a semiconducting surface;
   forming first conductivity type devices including first gate structures in a first device region of the substrate and second conductivity type devices including second gate structures in a second device region of the substrate, wherein the first conductivity type device is an n-type device, and the second conductivity type device is a p-type device;
   forming a protective dielectric mask overlying the second device region;
   forming a first work function metal semiconductor alloy adjacent the first gate structures in the first device region, wherein the first work function metal semiconductor alloy is composed of material that provides a work function substantially aligned with the conduction band of the n-type conductivity device, wherein the protective dielectric mask is overlying the second device region;
   forming a first strain inducing layer overlying the first device region of the substrate including the first work function metal semiconductor alloy, and atop the protective dielectric mask that is present in the second device region of the substrate;
   removing the first strain inducing layer that is overlying the protective dielectric mask and the protective dielectric mask to expose the second conductivity type devices;
   forming a second work function metal semiconductor alloy after removing the first strain inducing layer that is overlying the protective dielectric mask and the dielectric mask to expose the second conductivity type devices, in which the second work function metal semiconductor alloy is adjacent the second gate structures in the second device region, wherein the first work function metal semiconductor alloy is composed of a different material than the second work function metal semiconductor alloy, and the second work function metal semiconductor alloy is substantially aligned with the valence band of the p-type conductivity device; and
   forming a second strain inducing layer overlying the second device region of the substrate including the second work function metal semiconductor alloy.

2. The method of claim 1, wherein the forming of the protective dielectric mask overlying the second device region includes depositing a dielectric layer atop the first device region and the second device region; forming a photoresist mask overlying the dielectric layer that is present in the second device region, wherein a portion of the dielectric layer present in the first device region is exposed; and etching the portion of the dielectric layer that is present in the first device region, wherein a remaining portion of the dielectric layer provides the protective dielectric mask.

3. The method of claim 1, wherein the forming of the first work function metal semiconductor alloy adjacent the first gate structures in the first device region comprises depositing a first metal on the semiconductor surface of the first device region of the substrate adjacent to a portion of the semiconductor surface underlying the first gate structures; and annealing the first metal.

4. The method of claim 3, wherein the first metal comprises Er, Yb, Dy, Lu, Gd, Tb, Ho or combinations thereof.

5. The method of claim 1, wherein the forming of the first strain inducing layer overlying the first device region and atop the protective dielectric mask that is present in the second device region of the substrate includes depositing a layer of silicon nitride that induces a tensile strain in the n-type devices of the first device region of the substrate.

6. The method of claim 1, wherein the removing of the first strain inducing layer that is overlying the protective dielectric mask and the protective dielectric mask to expose the second conductivity type devices comprises planarizing the first strain inducing layer stopping on the protective dielectric mask to provide an upper surface of the protective dielectric mask that is coplanar with an upper surface of the first strain inducing layer that is in the first device region; and etching the protective dielectric mask selective to the first strain inducing layer.

7. The method of claim 1, wherein the forming of a second work function metal semiconductor alloy adjacent the second gate structures in the second device region comprises depositing a second metal on the semiconductor surface of the second device region of the substrate adjacent to a portion of the semiconductor surface underlying the second gate structures; and annealing the second metal.

8. The method of claim 7, wherein the second metal comprises Pt, Ir, Os or combinations thereof.

9. The method of claim 1, wherein the forming of the second strain inducing layer overlying the second device region of the semiconductor substrate includes depositing a layer of silicon nitride that induces a compressive strain in the p-type devices of the second device region of the substrate.

10. A method of forming a semiconductor device comprising:
    providing a substrate including a semiconducting surface;
    forming first conductivity type devices including first gate structures in a first device region of the substrate and second conductivity type devices including second gate structures in a second device region of the substrate;
    forming a protective dielectric mask overlying the second device region;
    forming a first work function metal semiconductor alloy adjacent the first gate structures in the first device region;
    forming a first strain inducing layer overlying the first device region of the substrate and atop the protective dielectric mask that is present in the second device region of the substrate;
    planarizing the first strain inducing layer stopping on the protective dielectric mask to provide an upper surface of the protective dielectric mask that is coplanar with an upper surface of the first strain inducing layer that is in the first device region;
    etching the protective dielectric mask selective to the first strain inducing layer to expose the second conductivity type devices;
    forming a second work function metal semiconductor alloy after removing the first strain inducing layer, in which the second work function metal semiconductor alloy is adjacent the second gate structures in the second device region; and
    forming a second strain inducing layer overlying the second device region of the substrate including the second work function metal semiconductor alloy, wherein the first conductivity type device is an n-type device, and the second conductivity type device is a p-type device.

11. The method of claim 10, wherein the forming of a second work function metal semiconductor alloy adjacent the second gate structures in the second device region comprises depositing a second metal on the semiconductor surface of the second device region of the substrate adjacent to a portion of the semiconductor surface underlying the second gate structures; and annealing the second metal.

12. The method of claim 11, wherein the second metal comprises Pt, Ir, Os or combinations thereof.

13. The method of claim 10, wherein the forming of the second strain inducing layer overlying the second device region of the semiconductor substrate includes depositing a layer of silicon nitride that induces a compressive strain in the p-type devices of the second device region of the substrate.

14. The method of claim 10, wherein the forming of the protective dielectric mask overlying the second device region includes depositing a dielectric layer atop the first device region and the second device region; forming a photoresist mask overlying the dielectric layer that is present in the second device region, wherein a portion of the dielectric layer present in the first device region is exposed; and etching the portion of the dielectric layer that is present in the first device region, wherein a remaining portion of the dielectric layer provides the protective dielectric mask.

15. The method of claim 10, wherein the forming of the first work function metal semiconductor alloy adjacent the first gate structures in the first device region comprises depositing a first metal on the semiconductor surface of the first device region of the substrate adjacent to a portion of the semiconductor surface underlying the first gate structures; and annealing the first metal.

16. The method of claim 15, wherein the first metal comprises Er, Yb, Dy, Lu, Gd, Tb, Ho or combinations thereof.

17. The method of claim 10, wherein the forming of the first strain inducing layer overlying the first device region and atop the protective dielectric mask that is present in the second device region of the substrate includes depositing a layer of silicon nitride that induces a tensile strain in the n-type devices of the first device region of the substrate.

* * * * *